United States Patent
Oishi et al.

(10) Patent No.: US 6,617,654 B2
(45) Date of Patent: Sep. 9, 2003

(54) SEMICONDUCTOR DEVICE WITH SIDEWALL SPACERS AND ELEVATED SOURCE/DRAIN REGION

(75) Inventors: Toshiyuki Oishi, Tokyo (JP); Kohei Sugihara, Tokyo (JP); Naruhisa Miura, Tokyo (JP); Yuji Abe, Tokyo (JP); Yasunori Tokuda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/955,488

(22) Filed: Sep. 19, 2001

(65) Prior Publication Data

US 2002/0045317 A1 Apr. 18, 2002

(30) Foreign Application Priority Data

Oct. 12, 2000 (JP) .......................... 2000-312128

(51) Int. Cl.$^7$ .............................. H01L 29/76
(52) U.S. Cl. ...................... 257/382; 257/383; 257/387; 257/388; 438/300
(58) Field of Search ................. 257/382, 383, 257/387, 388; 438/300

(56) References Cited

U.S. PATENT DOCUMENTS

| 5,710,450 A | * | 1/1998 | Chau et al. ............... 257/344 |
| 6,346,447 B1 | * | 2/2002 | Rodder ....................... 438/300 |
| 6,391,692 B1 | * | 5/2002 | Nakamura ................. 438/151 |

OTHER PUBLICATIONS

Gwoziecki et al., "Suitability Of Elevated Source/Drain For Deep Submicron CMOS", Proceeding of the 29$^{th}$ Solid–State Device Research Conference, Belgium, Sep. 1999, pp. 384–387.

* cited by examiner

Primary Examiner—Richard Elms
Assistant Examiner—Christian D. Wilson
(74) Attorney, Agent, or Firm—Leydig, Voit & Mayer, Ltd.

(57) ABSTRACT

Source and drain regions include regions of an epitaxial silicon film on the surface of the substrate and regions in the substrate. The depth of junctions of the source and drain regions is identical to or shallower than the depth of junctions of extension regions. As a result, even if the thickness of the side wall layer is reduced, since the depletion layer of the extension regions with lower impurity concentration compared with the source and drain regions is predominant, the short channel effect has a smaller effect.

7 Claims, 8 Drawing Sheets

Distance 1

Distance 2

SEMICONDUCTOR DEVICE WITH SIDEWALL SPACERS AND ELEVATED SOURCE/DRAIN REGION

BACKGROUND OF THE INVENTION

1. Field of the Invention

This invention relates to a semiconductor device such as Metal Oxide Semiconductor Field Effect Transistor (MOSFET) with a reduced size, and also relates to a method of manufacturing such a semiconductor device.

2. Description of the Related Art

FIG. 14 is a cross sectional view illustrating a conventional MOSFET having an extension structure described, for example, in Silicon Processing for the VLSI Era Volume 2, Process Integration, page 354 to 356. In the literature, this is called as an LDD (Lightly Doped Drain) structure and has also been called in recent years as an extension structure along with increasing its concentration of impurities. In the figure, reference numeral 1 denotes a p-type silicon substrate; 2, a device isolation region; 5, a gate insulating film; 6, an n-type polysilicon gate electrode; 9, extension regions; 10, side walls; 13a, a drain region of source/drain regions; 13b, a source region of the source/drain regions; 14, a depth of junction of the source/drain regions; 15, a depth of junction of extension regions; 16,17, silicide regions; 24, a depletion layer formed by the drain region; 25, a depletion layer formed by the source region.

A device structure and a manufacturing method of MOSFET having the conventional extension structure are to be explained briefly below.

At first, device isolation regions 2 for isolating active regions from the other ones are formed in the p-type silicon substrate 1. Boron, $BF_2$ or the like as p-type impurity are ion implanted to form a well (not illustrated). Then, a gate insulating film 5 and an n-type polysilicon film are deposited on the surface of the p-type silicon substrate 1. A gate electrode pattern is formed by photolithography, and etching is conducted using the pattern as a mask to form an n-type polysilicon gate electrode 6.

Successively, phosphorus, arsenic or the like as an n-type impurity is ion implanted to form extension regions 9 in a self-aligned manner. Then, side walls 10 are formed with a silicon oxide film, a silicon nitride film, or the like. Phosphorus, arsenic, or the like as an n-type impurity is ion implanted. Thereafter, heat treatment is applied to form n-type source/drain regions 13, which are then salicided to form the silicide region 16 in the gate electrode and the silicide region 17 in the source/drain regions, thereby completing a main portion of MOSFET.

For further improving the degree of integration of the transistor, it is necessary to reduce the size of individual MOSFETs and, as one of means for reducing the size, it is effective to reduce the thickness of the side walls 10.

However, in the prior MOSFET, since the junction 14 of the source/drain regions 13 is deeper than the junction 15 of the extension regions 9 from the surface of the silicon substrate 1, the source/drain regions 13 cover the extension regions 9 entirely, decreasing the thickness of the side walls 10, as shown in FIG. 15. As a result, the depletion layer 24 formed by the drain region 13a influences the source region 13b. The interval between the depletion layer 25 and the depletion layer 24 shortens from the distance 1 in the device structure with the thick side walls 10 in FIG. 14 to the distance 2 in the device structure with the thin side walls 10 in FIG. 15, increasing the operation voltage of the MOSFET. Such a short interval easily produces the short channel effect.

In view of the above, as a countermeasure, it may be considered to reduce the influence of the junction in the source/drain regions by making the depth of junction 14 of source/drain regions 13 shallower. However, when the depth of junction 14 is merely made shallow, since the entire thickness of the source/drain regions 13 is reduced, this results in the disadvantage of increasing the source/drain resistance.

SUMMARY OF THE INVENTION

This invention intends to reduce the size of the semiconductor device by decreasing the thickness of the side walls while preventing the disadvantage described above.

A semiconductor device according to this invention comprises: a gate electrode formed, through a gate insulating film, on a substrate of a first conductivity type; side walls formed on both lateral sides of the gate electrode; extension regions formed by introducing and diffusing impurity of a second conductivity type on both sides of the gate electrode in the substrate and having a predetermined depth of junction from the surface of the substrate; and source/drain regions composed of both an epitaxial growth film selectively grown on the substrate of the both sides of the gate electrode and regions introducing and diffusing impurities of a second conductivity type below the epitaxial growth film having a depth of junction identical with or shallower than the depth of junction of the extension regions. This can be provide an effect of reducing the size of MOSFET as a result that the thickness of the side walls can be reduced while keeping the excellent short channel effect and the low source/drain resistance.

A method of manufacturing a semiconductor device according to the invention has the steps of: forming a multi-layered film so as to form a gate electrode on a substrate of a first conductivity type and etching the multi-layered film to a predetermined pattern; forming side walls on both lateral sides of the gate electrode; introducing and diffusing impurities of a second conductivity type on both sides of the gate electrode in the substrate and conducting ion implantation of impurities of the second conductivity type and heat treatment under predetermined conditions so as to form extension regions having a predetermined depth of junction from the surface of the substrate; selectively forming an epitaxial growth film by an epitaxial growth method so as to form a portion of the source/drain regions on the substrate of both lateral sides of the gate electrode; conducting ion implantation of impurities of a second conductivity type in the substrate below the epitaxial growth film and heat-treating under predetermined conditions so as to form another portion of the source/drain regions having a depth of junction identical with or shallower than the depth of junction of the extension regions. This can provide an effect capable of efficiently manufacturing a semiconductor device with reduced size of MOSFET while keeping the excellent short channel effect.

DETAILED DESCRIPTION OF THE PREFERRED EMBODIMENT

Embodiment 1

A first embodiment of this invention is to be explained. An n-type MOSFET (metal oxide Semiconductor Field Effect Transistor) is exemplified in the same manner as in the prior example. FIG. 1 to FIG. 7 schematically shows, with cross sections, the manufacturing method and the device structure of the n-type MOSFET according to the embodiment of this invention.

Figure 1:
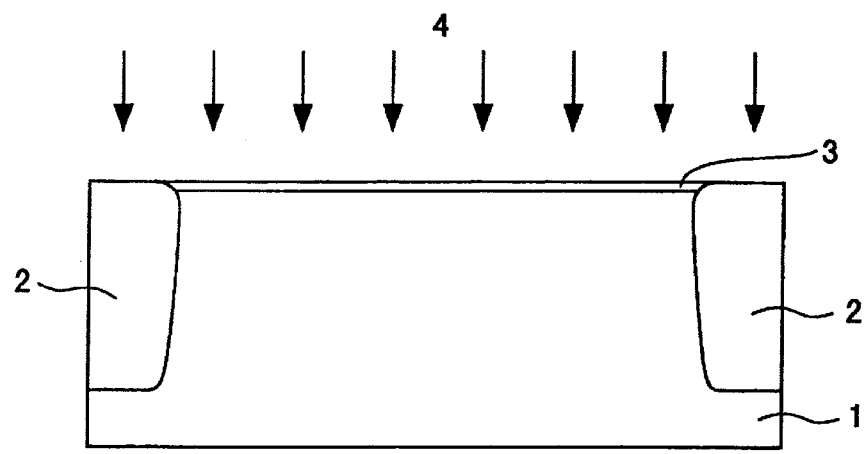
FIGS. 1–7 are cross sectional views each illustrating a manufacturing method and a device structure of the semiconductor device of a first embodiment of this invention.

At first, as shown in FIG. 1, device isolation regions 2 are formed in a p-type silicon substrate 1. Boron, $BF_2$ or the like as p-type impurity is ion implanted as shown at numeral 4 through a pad oxide film 3 on the surface of the silicon substrate 1 to form a well, a channel cut region, and a channel region (not illustrated). Preferably, the acceleration voltage for the ion implantation upon forming the well and the channel cut region, while depending on the species of implanted ions, is within a range from 100 keV to 5 MeV, and the dosing amount is about from $10^{12}$ to $10^{15}$ cm$^{-2}$. Preferably, the acceleration voltage for the ion implantation upon forming the channel region, while also depending on the species of the implanted species, is within a range from 5 keV to 50 keV and the dosing amount is about from $5\times10^{10}$ to $10^{12}$ cm$^{-2}$.

Figure 2:
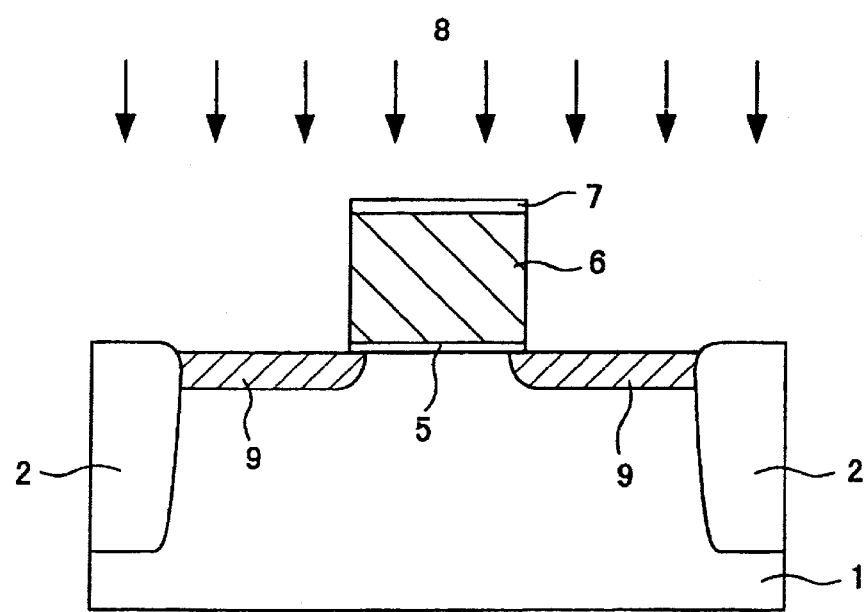

After removing the pad oxide film 3, a gate insulating film 5, an n-type polysilicon film for a gate electrode 6, a silicon oxide or a nitride film 7 is deposited successively. Next, the gate electrode pattern is formed by photolithography and dry etching techniques, thereafter, the silicon oxide or silicon nitride film 7 is etched using the pattern as a mask. Then, the n-type polysilicon film and the gate insulating film 5 are etched to form an n-type polysilicon gate electrode 6, as shown in FIG. 2. Successively, extension regions 9 are formed by ion implantation 8. Specific examples of implanted ion upon forming the extension regions 9 include n-type impurities such as arsenic, phosphorus and the like. Preferably, the acceleration voltage is within a range from 0.1 keV to 20 keV and the dosing amount is about from $10^{13}$ to $10^{15}$ cm$^{-2}$ while depending on the species of the implanted ion. Thus, the concentration of impurity in the extension regions 9 is lower than that of the source/drain regions 13.

Figure 3:
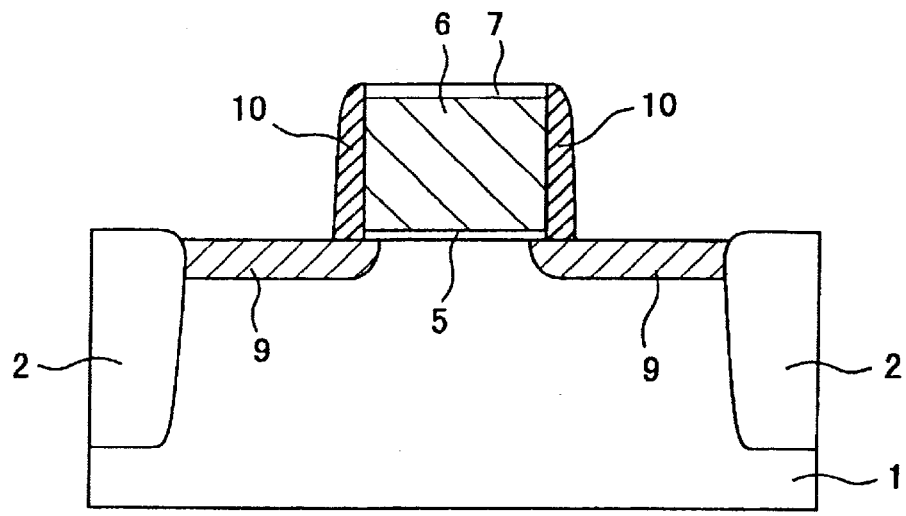

After depositing a silicon nitride film over the entire wafer surface, side walls 10 made of silicon nitride are formed by etching back (see FIG. 3). The side walls 10 may be constituted with a silicon oxide film, or a multi-layered film of a silicon oxide film and a silicon nitride film.

The thickness of the side walls 10 at a portion in contact with the silicon substrate 1 should be at least a minimum thickness required for isolating the extension regions 9 from the source/drain regions 13 to be described later, that is, preferably, within a range from 7.5 nm to 40 nm with a view point of reducing the size of individual MOSFETs.

Figure 4:
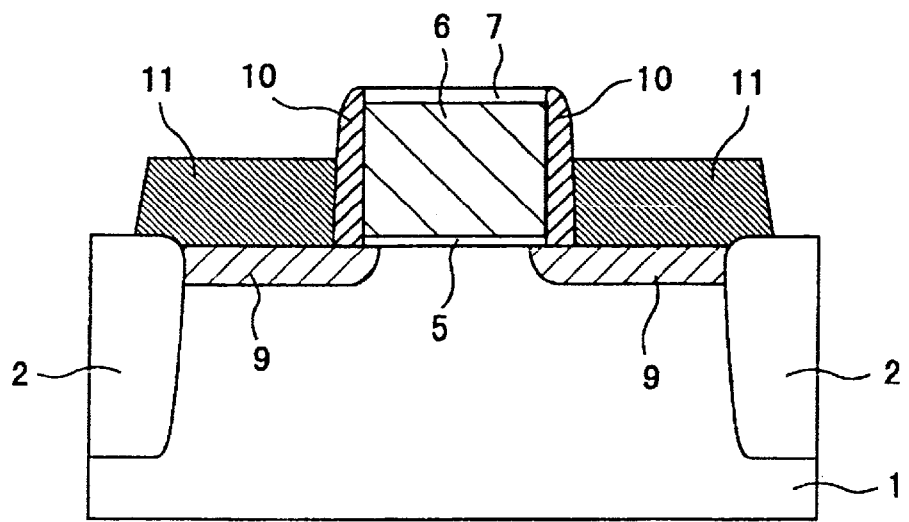

Then, an epitaxial silicon film 11 is selectively grown on the surface at which the extension regions 9 are exposed (see FIG. 4). Such selective epitaxial growth can easily be obtained by a conventional epitaxial growth method, for example, a chemical vapor deposition (CVD) under super-high vacuum, or low pressure. From the viewpoint of not making the source/drain resistance increase, the thickness of the epitaxial silicon film 11 may suitably be about 10 nm or more.

In the case of the CVD under super-high vacuum, an example of epitaxial growth condition preferably includes a flow rate of a disilane as a source gas of 1 to 10 sccm, a flow rate of a chlorine gas required for selective epitaxial growth of 1 to 10 sccm and a substrate temperature of 400 to 900° C.

Although FIG. 4 shows a cross sectional view in which the epitaxial silicon film 11 is not grown on the n-type polysilicon gate electrode 6, selective epitaxial growth may be conducted after removing the silicon oxide or silicon nitride film 7 on the n-type polysilicon gate electrode 6. In this case, an epitaxial film may be grown also on the n-type polysilicon gate electrode 6. Here, the deposited epitaxial silicon film 11 may or may not contain impurities. Although the epitaxial growth film is made of silicon as described above, other IV group element or a mixture thereof, such as silicon/germanium and silicon/germanium/carbon, may be used as the material for the epitaxial growth film, and, further, a multi-layered film comprising such material may be used for the same. Impurities may be contained or not contained in the film like that in the case of using silicon alone.

Figure 5:
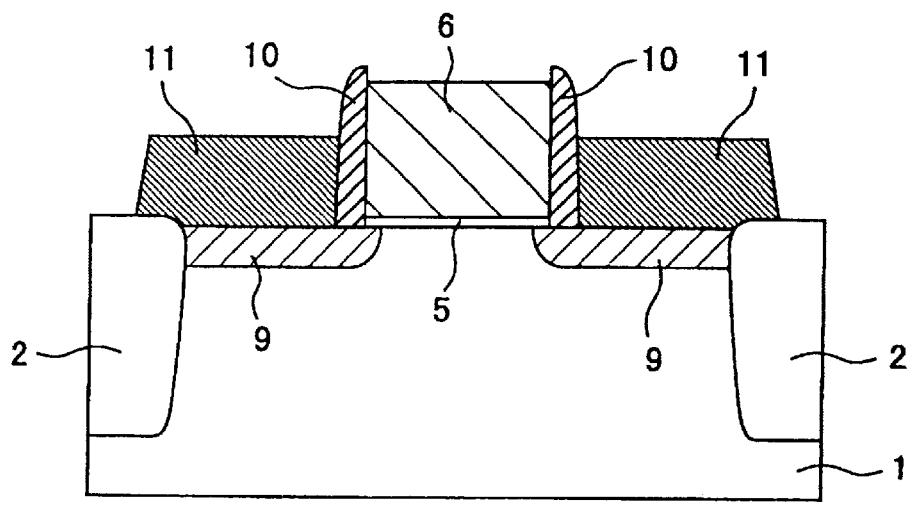

In the next step, for ion implantation of impurity to the n-type polysilicon gate electrode 6, the silicon oxide film 7 on the n-type polysilicon gate electrode 6 is removed by wet etching using fluoric acid (see FIG. 5).

Figure 6:
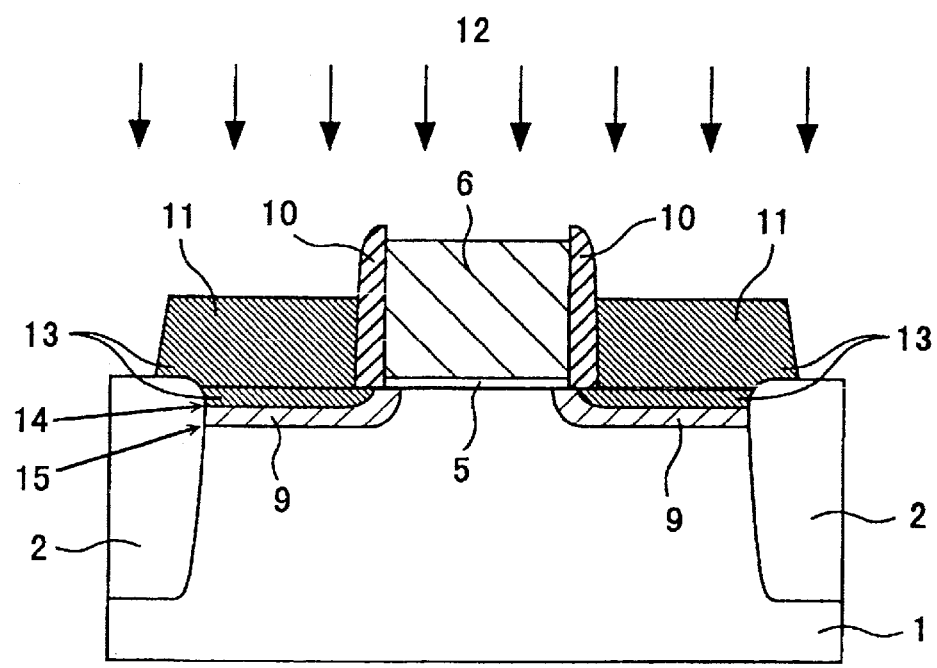
Figure 7:
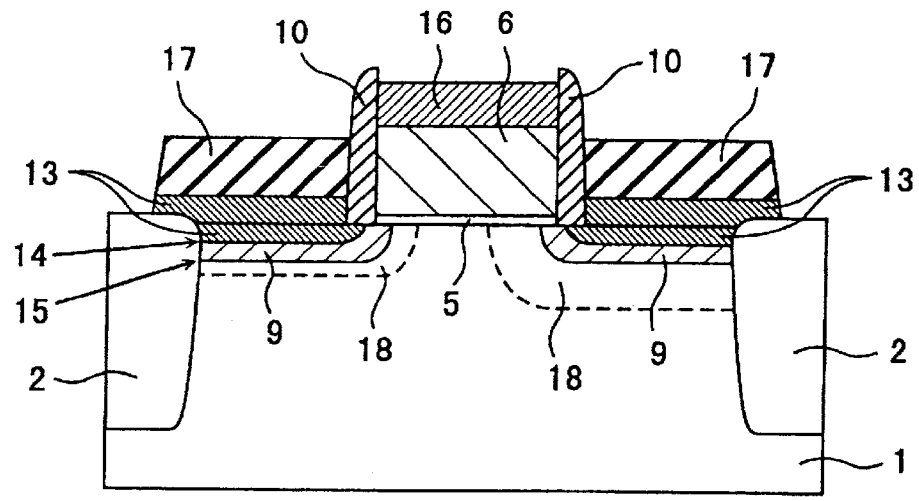

Successively, for forming source/drain regions 13 including the epitaxial silicon film 11 at a portion thereof, n-type impurity is ion implanted (see numeral 12), as shown in FIG. 6. As the species for the implanted ions in the n-type MOSFET, the element that acts as n-type impurity in silicon, that is, arsenic, phosphorus or the like is used. Preferably, the acceleration voltage, while depending on the species of the implanted ions, is within a range from 0.5 keV to 500 keV and dosing amount is preferably about from $5\times10^{14}$ to $5\times10^{15}$ cm$^{-2}$.

Taking the effect of the impurity diffusion in the heat treatment to be described later into consideration, the acceleration voltage and the dosing amount upon ion implantation are controlled such that the depth of the junction 14 of the source/drain regions is identical with or shallower than that of the junction 15 of the extension regions 9 from the surface of the silicon substrate 1, as shown in FIG. 6. The source/ drain regions 13 consists of both a region having the epitaxial silicon film 11 on the silicon substrate 1 and the ion implanted and diffused region of the n-type impurities within the silicon substrate 1, as described above.

The impurities contained in both the extension regions 9 and the source/drain regions 13 are thermally diffused by the heat treatment in the subsequent step (see FIG. 6). Each of the depth of junctions is defined as a distance from the surface of the silicon substrate 1 to a portion where the impurity concentration is just $10^{18}$ cm$^{-3}$.

In the case where the epitaxial silicon film 11 is selectively grown with impurity ions and originally has impurities, the ion implantation step may be omitted. In this case, taking the distance along which the impurities are diffused by the heat treatment in the subsequent step into consideration, conditions of ion implantation upon forming the extension regions 9 and heat treatment are controlled such that the depth of junction 14 formed by the diffused impurities is identical with or shallower than the depth of the junction 15 of the extension regions 9.

Then, cobalt is deposited on the entire surface of the wafer, thereafter silicide region is formed at a portion in contact with the epitaxial silicon film 11, that is, the n-type polysilicon gate electrode 6 and the source/drain regions 13. After the unreacted cobalt is removed, a silicide region 16 is formed into the n-type polysilicon gate electrode 6. A silicide region 17 is also formed in the source/drain regions 13 respectively and selectively (see FIG. 7).

In the n-type MOSFET manufactured by way of such steps, the influence of the depletion layer extending from the source/drain regions 13 is at a negligible level, since the depth of the junction 14 of the source/drain regions 13 is made identical with or shallower than that of the junction 15 of the extension regions 9. As a result, the short channel effect is controlled by the depletion layers 18 formed by the extension regions 9. Since the impurity concentration of the extension regions 9 is lower than that of the source/drain regions 13, the short channel effect is improved outstandingly compared with the case where the depletion layer of the source/drain regions 13 is predominant.

Furthermore, in the device structure of this embodiment, since the problem caused by the source/drain resistance described later can be avoided by the presence of the epitaxial silicon film 11 grown on the surface of the silicon substrate 1 even when the thickness of the side walls 10 is decreasing compared with the prior device structure, the depth of the source/drain regions 13 from the surface of the silicon substrate 1, that is, the depth of junction 14 of the source/drain regions can be formed at level shallower in the silicon substrate 1 than that of the conventional device structure. Accordingly, the degree of extension of the depletion layer formed by the source/drain regions 13 is outstandingly decreased compared with that of the conventional device structure having the deep source/drain regions. As a result, the device structure of this embodiment has a remarkable effect that the short channel effect is difficult to occur compared with the conventional device structure in spite that the thickness of the side walls 10 is thinner.

In the conventional device structure, when the depth of junction of the source/drain regions 13 is only made shallower, a problem of increasing the source/drain resistance is caused. However, in the structure of this embodiment, since the epitaxial silicon film 11 grown on the silicon substrate 1 also operates effectively as a portion 13 of the source/drain regions, the source/drain resistance decreases by so much. Accordingly, the thickness of the side walls 10 can be reduced by adopting such a device structure, which is effective for the micro-fabrication of MOSFET.

The above explanations have been made to an example of an n-type MOSFET; however, it is applicable also to p-type MOSFET.

Embodiment 2

Figure 8:
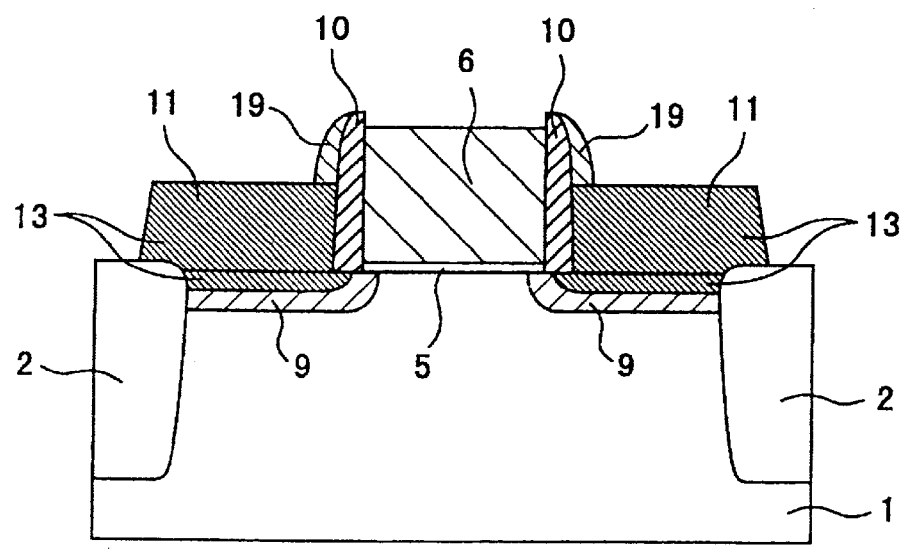
FIGS. 8 and 9 are cross sectional views each illustrating a manufacturing method of the semiconductor device of a second embodiment of this invention.
Figure 9:
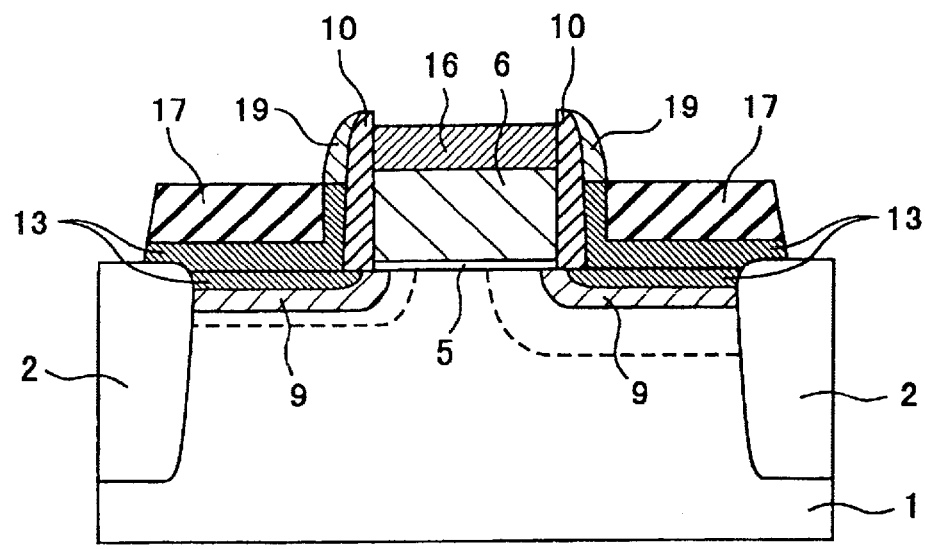
Figure 10:
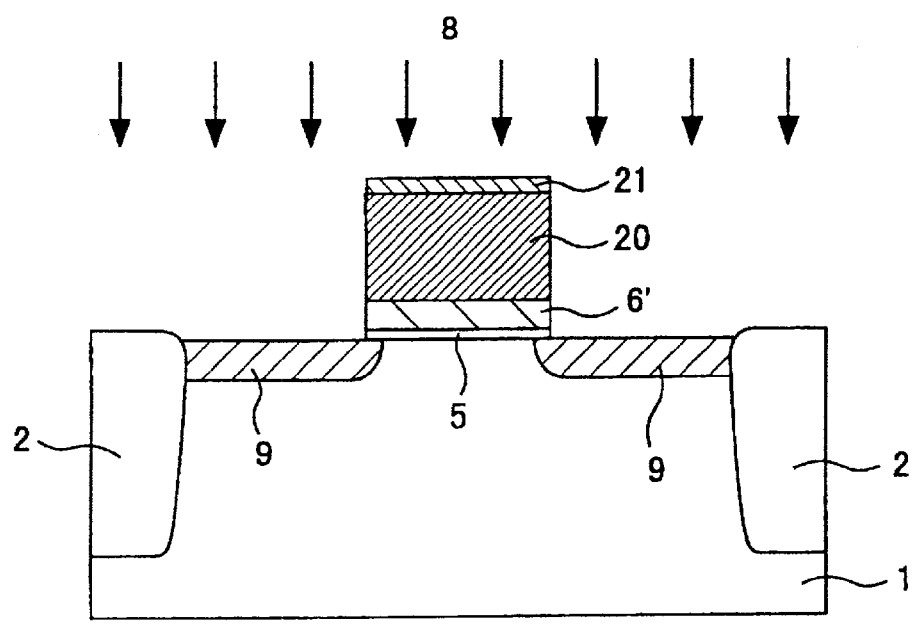
FIGS. 10–13 are cross sectional views each illustrating a manufacturing method of the semiconductor device of a third embodiment of this invention.

In place of using salicide process in the first embodiment, as shown in FIGS. 8 and 9, a method of forming an epitaxial silicon film 11, and second side walls 19 on the side walls 10 and then conducting salicidation to form silicide regions 16, 17 in both the n-type polysilicon gate electrode 6 and the epitaxial silicon film 11, respectively is also effective.

Advantages of forming the second side walls 19 is to be explained.

The epitaxial silicon film 11 is only grown on the source/drain portion by selective epitaxial growth. However, depending on the epitaxial growth condition, the epitaxial silicon film is often deposited partially to a portion upon the sidewalls 10. When salicidation is conducted in this state, the epitaxial silicon film deposited on a portion upon the side walls 10 is also silicided. Furthermore, the deposited film is extended over the side walls 10 and in contact with a portion upon the n-type polysilicon gate 6 to possibly result in a disadvantage of causing short circuit between the n-type polysilicon gate electrode 6 and the source/drain regions 13.

After forming the epitaxial silicon film 11, when second side walls 19 are formed on the side walls 10 (see FIG. 8), short circuit between the n-type polysilicon gate electrode 6 and the source/drain regions 13 can be prevented because no epitaxial silicon film can be formed thereon after salicidation (see FIG. 9) in view of the step, which provides an effect capable of stable forming excellent MOSFETs for microfabrication.

Embodiment 3

A manufacturing method and a structure of MOSFET according to a third embodiment are to be explained. In the manufacturing method, since steps shown in FIG. 1 for the first embodiment are identical, subsequent steps are explained with reference to FIGS. 10 to 13.

After removing the pad oxide film 3 from the wafer, a gate insulating film 5 is deposited. Then, a metal or silicide conductor film 20 and a film comprising a silicon nitride film and/or a silicon oxide film 21 are successively formed, thereafter, a gate electrode pattern is formed by photolithography and dry etching techniques. The film 21 is dry etched using the pattern as a mask. Next, the metal or silicide conductor film 20 and the n-type polysilicon film are etched to form an n-type polysilicon gate electrode 6'. Then, extension regions 9 are formed by ion implantation 8. The conditions of ion implantation are identical with those in the first embodiment.

The metal or silicide conductor film 20 used as a portion of the n-type polysilicon gate electrode described above may include a film, for example, composed of tungsten, cobalt, copper, aluminum, nickel, molybdenum or silicides thereof, or a multi-layered film constituted with materials thereof. In addition, same effects can also be provided when the gate electrode is composed only of the conductor film 20, besides the two-layer composition of the polysilicon film 6' and the conductor film 20.

Figure 11:
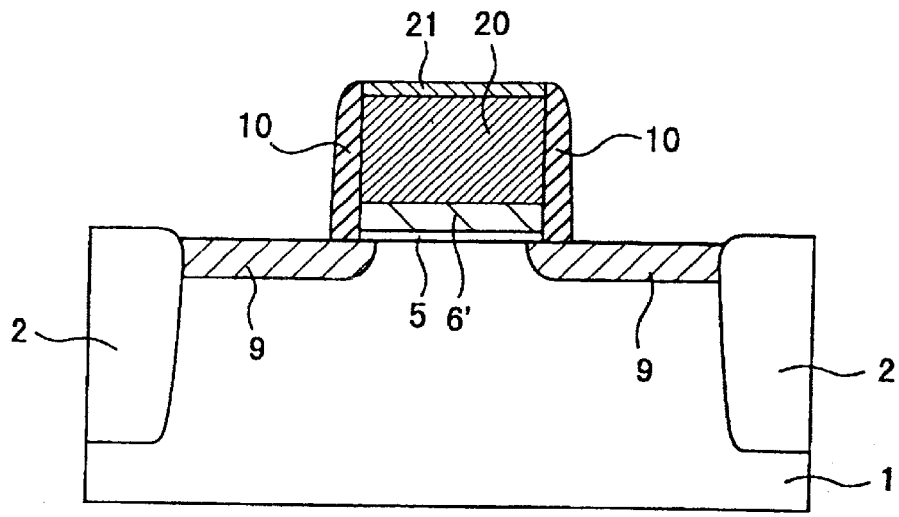

After depositing a silicon nitride film over the entire surface of the wafer, side walls 10 made of silicon nitride, are formed by etch back technique (see FIG. 11). The side walls 10 may be constituted with a silicon oxide film, or a multi-layered film of a silicon oxide film and a silicon nitride film.

Figure 12:
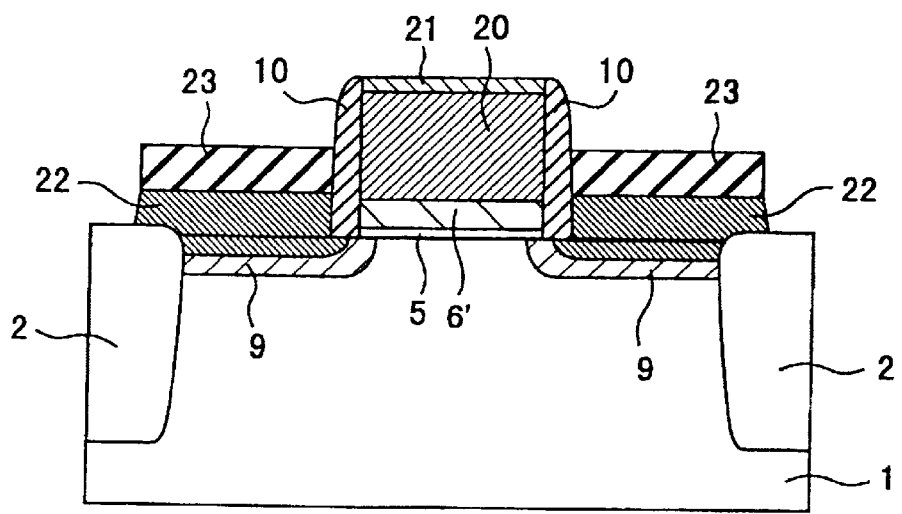
Figure 13:
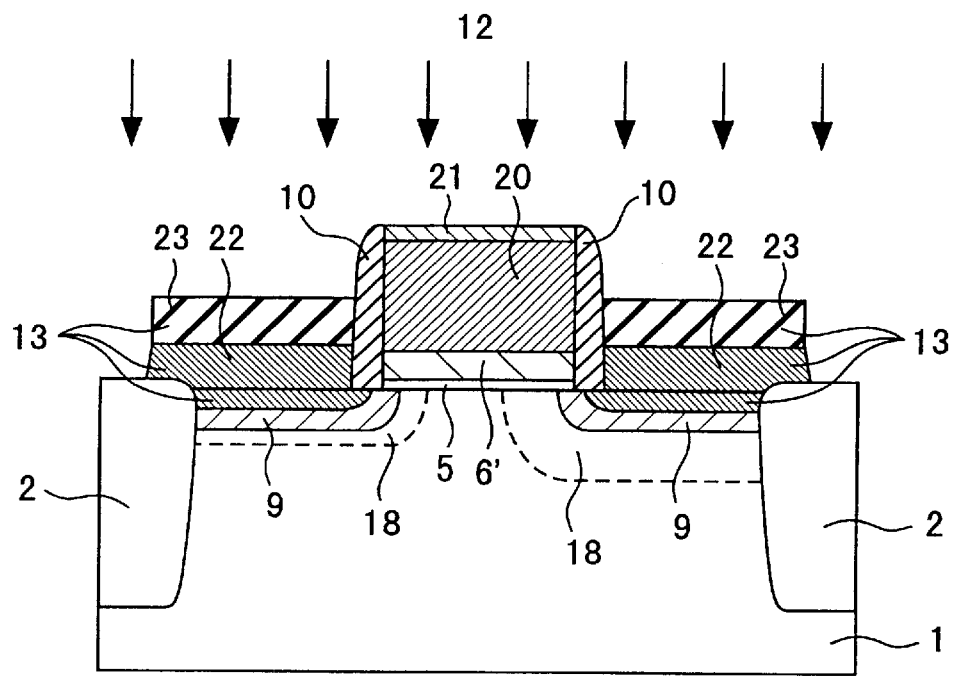
Figure 14:
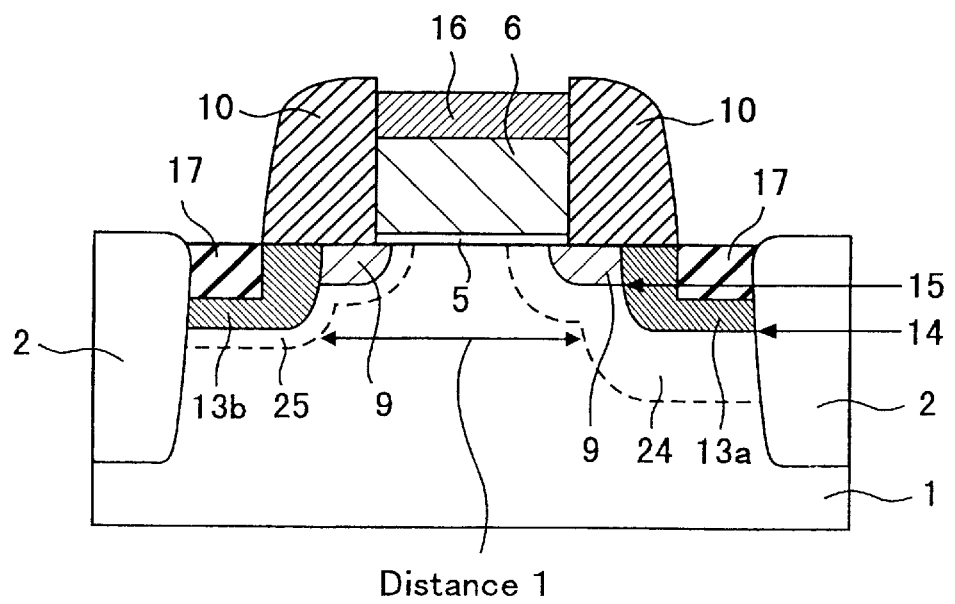
FIGS. 14 and 15 are cross sectional views each illustrating a conventional semiconductor device.
Figure 15:
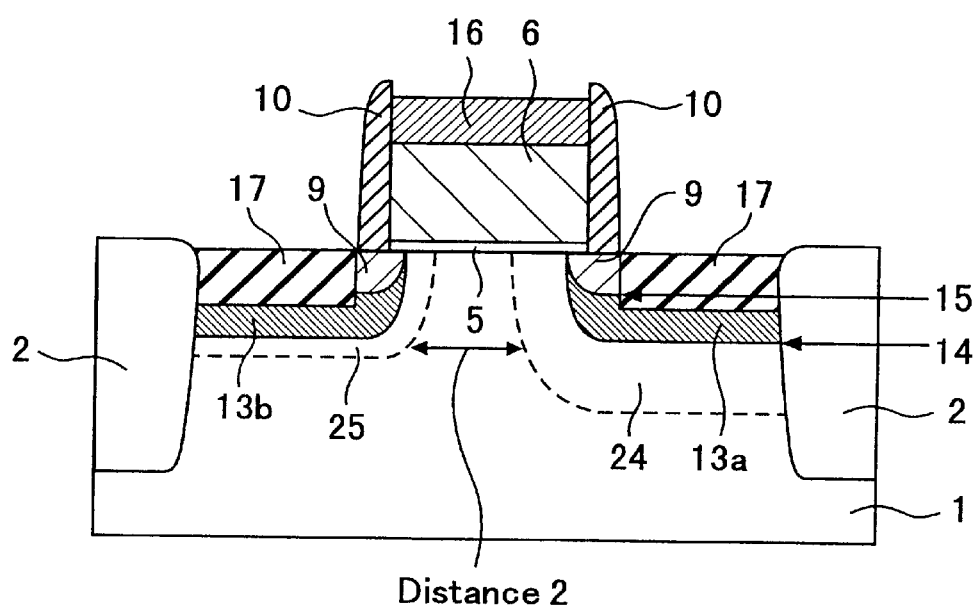

Then, an epitaxial silicon film 22 and a tungsten film 23 are selectively deposited successively on the exposed surface of the extension regions 9 (see FIG. 12). This can be achieved by the same conventional epitaxial growth method as in the first embodiment, that is, CVD under super-high vacuum or a chemical vapor epitaxial growth method under low pressure. As the thickness for the epitaxial silicon film 22 and the tungsten film 23 of such extent which does not increase the source/drain resistance, it is 5 nm or more for the epitaxial silicon film 22 and 5 nm or more for the tungsten film 23. For the epitaxial silicon film 22, impurities may or may not be incorporated like that in the first embodiment. Furthermore, the material to be deposited may contain, in addition to silicon, other IV group element such as silicon/germanium or silicon/germanium/carbon, or it may be a multi-layered film comprising the materials described above. For the impurities of the film, they may or may not be contained like that in the case of using silicon alone. It will be apparent that same effect can be provided when the conductor film 23 is made of cobalt, copper, aluminum, nickel, molybdenum or silicides thereof instead of tungsten. Ion implantation is carried out as illustrated at numeral 12 to form source/drain regions 13 in the silicon substrate 1 to complete a semiconductor device which cross sectional view is shown in FIG. 13.

The advantages obtained by adopting such a constitution will be explained. For reducing the gate electrode resistance or the source/drain resistance of MOSFET, it is preferred to use a conductor film made of a metal to a portion of each of the gate electrode, and the source/drain regions. Accordingly, the device structure of the third embodiment has an advantage of further reducing the gate electrode resistance and the source/drain electrode resistance to improve the device characteristic compared with that of the first embodiment.

Referring to the cross sectional shape of the device structure of the second embodiment shown in FIG. 9, the silicide region 16 is exposed to the surface on the n-type polysilicon gate electrode 6. On the contrary, in the cross sectional shape of the device structure of the third embodiment, that is, the device structure shown in FIG. 13, the film 21 comprising only the silicon nitride film or the silicon oxide film and the silicon nitride film is formed on the gate electrode.

Generally, in MOSFET, an interlayer insulating film is deposited on the wafer and, optionally, a contact layer is formed after forming the gate electrode, to electrically connect the wiring on the interlayer insulating film and transistors below the interlayer insulating film, in which a structure of a self-aligned contact (SAC) is often adopted. When the SAC structure is applied, if the position of the contact layer to be disposed on the source/drain regions is displaced and in contact with the n-type polysilicon gate electrode 6', etching can be stopped at the film 21. Therefore electric short circuit between the contact layer and the n-type polysilicon gate 6' can be prevented. This is because the interlayer insulating film is generally constituted with an oxide film, as a result, makes it possible to adopt a so-called selective etching technique of etching only the silicon oxide film and scarcely or not etching the film 21.

To obtain the SAC structure having such an excellent feature, it is necessary that the film 21 comprising only the silicon nitride film or the silicon oxide film and the silicon nitride film are previously formed to a portion upon the n-type polysilicon gate electrode 6'. Because the conductor film 20 such as made of tungsten has to be used.

The constitution of the conductor film 20, exemplified by the tungsten film, for both of the n-type polysilicon gate 6' and the portion 23 of the source/drain regions have been explained above. It will be apparent that the effect of reducing the electric resistance of the n-type polysilicon gate electrode 6' and of the source/drain regions 13 can be produced satisfactory at all in the combination of using a tungsten film for the n-type polysilicon gate electrode 6' and a silicide region for a portion of the source/drain regions.

What is claimed is:

1. A semiconductor device comprising:

a gate electrode and a gate insulating film sequentially disposed on a surface of a substrate, the substrate having a first conductivity type;

side walls on both lateral sides of the gate electrode;

extension regions having a second conductivity type, located on both sides of the gate electrode; in the substrate, and having a junction depth relative to the surface of the substrate; and source and drain regions including both
an epitaxial film on the surface of the substrate on both sides of the gate electrode and
regions having the second conductivity type, located within the substrate, contiguous to the extension regions, extending along interfaces of the epitaxial film and the surface of the substrate, and having a junction depth no deeper than the junction depth of the extension regions.

2. The semiconductor device as defined in claim 1, wherein junctions of the source and drain regions with the extension regions are separated from junctions of the extension regions with the semiconductor substrate by at least 10 nm.

3. The semiconductor device as defined in claim 1, wherein the epitaxial film comprises at least one element selected from the group consisting of silicon, germanium, and carbon, and combinations thereof.

4. The semiconductor device as defined in claim 1, wherein the epitaxial film comprises a first epitaxial film including at least one element selected from the group consisting of silicon, germanium, and carbon, and combinations thereof, and a second film on the substrate comprising a thin conductive film including at least one selected from the group consisting of tungsten, cobalt, copper, aluminum, nickel, and molybdenum, a silicide of tungsten, cobalt, copper, aluminum, nickel, and molybdenum, and combinations thereof.

5. The semiconductor device as defined in claim 1, including a suicide region in at least the epitaxial film and a portion of the gate electrode.

6. The semiconductor device as defined in claim 1, wherein a portion of the gate electrode comprises a film including at least one selected from the group consisting of tungsten, cobalt, copper, aluminum, nickel, and molybdenum, a silicide of tungsten, cobalt, copper, aluminum, nickel, and molybdenum, and combinations thereof.

7. The semiconductor device as defined in claim 1, wherein the side walls in contact with the substrate have a thickness within a range of 7.5 nm to 40 nm.

* * * * *